(12) United States Patent
Pedersen et al.

(10) Patent No.: US 8,775,694 B2
(45) Date of Patent: Jul. 8, 2014

(54) ADC SEQUENCING

(71) Applicant: Atmel Corporation, San Jose, CA (US)

(72) Inventors: Frode Milch Pedersen, Trondheim (NO); Romain Oddoart, Petit-Mars (FR); Cedric Favier, Saint Mars du Desert (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/624,644

(22) Filed: Sep. 21, 2012

(65) Prior Publication Data

US 2014/0089536 A1     Mar. 27, 2014

(51) Int. Cl.
*G06F 13/28*     (2006.01)
*G06F 3/05*      (2006.01)

(52) U.S. Cl.
USPC ................ 710/22; 710/69; 710/308

(58) Field of Classification Search
CPC ....................................... G06F 13/28
USPC ........................................ 710/22–28, 69, 308
See application file for complete search history.

(56) References Cited

U.S. PATENT DOCUMENTS

| 6,701,395 B1 * | 3/2004 | Byrne et al. ............... 710/69 |
| 2010/0245148 A1 * | 9/2010 | Adamo et al. ............... 341/155 |

* cited by examiner

*Primary Examiner* — Christopher Shin
(74) *Attorney, Agent, or Firm* — Fish & Richardson P.C.

(57) ABSTRACT

A device comprises a central processing unit (CPU) and a memory configured for storing memory descriptors. The device also includes an analog-to-digital converter controller (ADC controller) configured for managing an analog-to-digital converter (ADC) using the memory descriptors. In addition, the device includes a direct memory access system (DMA system) configured for autonomously sequencing conversion operations performed by the ADC without CPU intervention by transferring the memory descriptors directly between the memory and the ADC controller for controlling the conversion operations performed by the ADC.

20 Claims, 7 Drawing Sheets

ADC SEQUENCING

TECHNICAL FIELD

This disclosure relates generally to sequencing analog-to-digital converters (ADCs).

BACKGROUND

An analog-to-digital converter (ADC) is generally implemented as a hardware peripheral in a computing system. Typically, the ADC is used for performing conversion of analog to digital data.

SUMMARY

A computing system architecture may be designed to execute ADC conversion operations autonomously, that is, without using the central processing unit (CPU). The computing system may include a Direct Memory Access (DMA) system for managing the ADC conversion operations. The DMA system, which may be a central DMA system, autonomously transfers data between shared memory and peripheral components. The DMA system may be used to transfer configuration data for the ADC conversion operations from memory to a controller managing the ADC without using the CPU.

In one general aspect, a device comprises a central processing unit (CPU) and a memory configured for storing memory descriptors. The device also includes an analog-to-digital converter controller (ADC controller) configured for managing an analog-to-digital converter (ADC) using the memory descriptors. In addition, the device includes a direct memory access system (DMA system) configured for autonomously sequencing conversion operations performed by the ADC without CPU intervention by transferring the memory descriptors directly between the memory and the ADC controller for controlling the conversion operations performed by the ADC.

Particular implementations of the memory device may include one or more of the following features. The CPU may be configured to be idle or performing reduced activities at a time when a conversion operation is performed by the ADC. The CPU may be configured to perform activities unrelated to the ADC at the time when the conversion operation is performed by the ADC.

The ADC controller may be configured for setting parameters for conversion operations performed by the ADC based on information included in memory descriptors received from the DMA system. The memory descriptors received from the DMA system at the ADC controller may comprise information on per-channel settings for conversion operations performed by the ADC, wherein a channel is associated with an input pin of the ADC. The per-channel settings for the conversion operations performed by the ADC may comprise amplification gain, gain compensation, single-ended or bipolar operating mode, channel polarity and selection of negative and positive channels of the ADC.

The ADC controller may include a first register configured for storing parameters for a conversion operation performed by the ADC based on information included in a memory descriptor received from the DMA system. The information included in a memory descriptor received from the DMA system may correspond to one conversion operation performed by the ADC.

The ADC controller may include a second register configured for storing a result of a conversion operation performed by the ADC. The result of the conversion operation performed by the ADC may be transferred from the second register to the memory using a memory descriptor, and wherein the DMA system may be configured for transferring the result of the conversion operation performed by the ADC from the second register to the memory using the memory descriptor.

The DMA system may be configured for autonomously sequencing conversion operations performed by an additional peripheral hardware without CPU intervention by transferring the memory descriptors directly between the memory and a controller managing the additional peripheral hardware.

The DMA system may be configured for transferring memory descriptors to the ADC controller in response to receiving a ready signal from the ADC controller. A ready signal may be uniquely associated with a single transfer cycle. The DMA system may be configured for transferring a single memory descriptor in one transfer cycle.

The number of conversion operations performed by the ADC may be limited by a number of the memory descriptors stored in the memory. The order of the conversion operations performed by the ADC may be based on an arrangement of the memory descriptors in the memory. A size of a memory descriptor may be 32 bit, 64 bit or 128 bit.

In another general aspect, a device comprises a central processing unit (CPU), a memory configured for storing memory descriptors and a controller configured for managing a peripheral hardware module using the memory descriptors. The device also comprises a direct memory access system (DMA system) configured for autonomously sequencing operations performed by the peripheral hardware module without CPU intervention by transferring the memory descriptors directly between the memory and the controller for controlling the operations performed by the peripheral hardware module.

The details of one or more disclosed implementations are set forth in the accompanying drawings and the description below. Other features, aspects, and advantages will become apparent from the description, the drawings and the claims.

DETAILED DESCRIPTION

In computing system architecture, an ADC is generally implemented as a peripheral hardware component that is configured for processing analog data and returning a digital result due to the processing. The operation of the ADC is controlled by an ADC controller, which provides an interface between the ADC and various other components of the computing system.

Each conversion performed by the ADC may be referred to as an ADC sequence or ADC conversion sequence, and the ADC operation for performing the conversion may be referred to as ADC sequencing operation or simply as ADC sequencing. The ADC includes a number of input pins and a number of output pins, which are also referred to as channels. An ADC sequencing operation uses detailed settings for each pin or channel that is involved in the operation. The settings may be stored in memory included in the computing system.

Typically, during an ADC sequencing operation, the central processing unit (CPU) or microcontroller in the computing system communicates with the ADC controller and the memory for managing the ADC operation, that is, transfer of the per channel settings to the ADC, and transferring the results of the conversion to the memory. The CPU may be fully occupied for the entire duration of the ADC sequencing, and thus unavailable to perform other work. Therefore, the CPU processing resources are utilized and power is consumed by the CPU during ADC sequencing operations, even if the CPU may not be performing the conversions by itself.

It may be useful to design a computing system architecture in which ADC conversion sequences are performed without using the CPU for managing the ADC sequencing operations. In such architecture, the CPU may be employed for performing other operations while an ADC sequencing operation is executed autonomous to the CPU, thereby increasing the throughput. Alternatively, the CPU may be idle or in a reduced activity state while the ADC sequencing operation is executed, thereby lowering the power consumption by the computing system.

In some implementations, complex ADC sequencer circuits may be implemented in hardware state machines to perform ADC sequencing without using CPU resources. However, implementation of such ADC sequencer circuits may incur very high cost. In addition, they may provide limited flexibility in performing ADC sequencing without involving the CPU.

In some implementations, a computing system architecture in which ADC sequencing is performed autonomously, that is, without using the CPU, may be designed and implemented by using the Direct Memory Access (DMA) system for managing the ADC conversion sequence. Some computing system architectures employ a central DMA system for autonomously transferring data between shared memory and peripheral components. The central DMA system may be used to sequence the ADC conversion operations autonomously.

Figure 1:
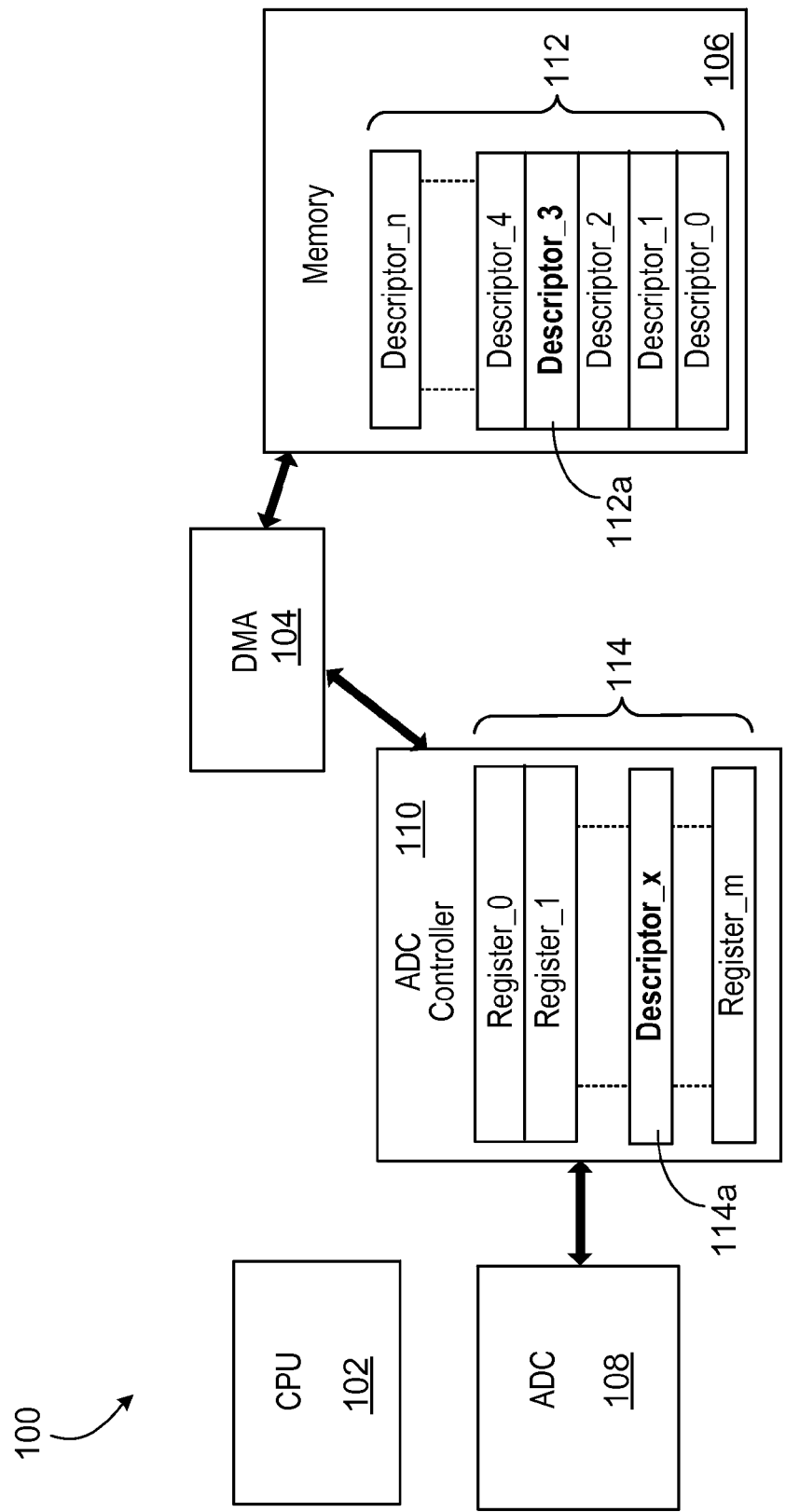
FIG. 1 is a conceptual block diagram of an exemplary computing system that performs ADC sequencing operations without CPU intervention.

FIG. 1 is a conceptual block diagram of an exemplary computing system 100 that performs ADC sequencing operations without CPU intervention. The computing system 100 includes a CPU 102, a DMA system 104 and memory 106. The computing system 100 also includes several peripheral components, such as an ADC 108. Associated with the ADC 108 is an ADC controller 110. The memory 106 includes memory descriptors 112, some of which, such as 112a, may be used for ADC sequencing. The ADC controller includes registers 114, some of which, such as 114a, may be used for storing memory descriptors.

The CPU 102 is a hardware component within the computing system 100 that is configured for executing the instructions of a computer program by performing the basic arithmetical, logical, and input/output operations of the system. In some implementations, the CPU is connected to all other hardware included in the system, such as the DMA 104, the memory 106, and the ADC 108 through the ADC controller 110.

In some implementations, the CPU 102 implements a reduced instruction set computer (RISC) instruction set architecture (ISA). For example, the CPU 102 may implement an Advanced RISC (ARM) instruction set, such that the CPU 102 is an ARM microcontroller. The CPU 102 may execute 32-bit instructions, 64-bit instructions, 128-bit instructions, or even higher sizes, such as 256-bit advanced vector extensions.

The DMA system 104, also known as DMA controller or simply as DMA, is a hardware component within the computing system 100 that can generate memory addresses and initiate memory read or write cycles. The DMA 104 allows some hardware components within the computing system 100 to access the system memory independently of the CPU 102.

In some implementations, the DMA 104 may be a central DMA system in the computing system 100, such as in an ARM microcontroller. In such implementations, the DMA 104 is able to transfer data autonomously between the shared system memory and peripheral hardware components. In such implementations, the DMA 104 may be configured with added functionality for performing ADC sequencing without involving the CPU 102, as described in greater detail in the following sections.

The memory 106 is a hardware component of the computing system 100 that stores data and instructions in memory cells that are indexed by memory addresses. The memory 106 may be any appropriate memory device, such as random access memory (RAM), including various types of RAM. In some implementations, the memory 106 may include read-only memory (ROM), including various types of a ROM such as an erasable programmable read-only memory (EPROM) or an EEPROM.

In some implementations, the memory 106 may be a shared RAM that is simultaneously accessible for reading and writing by different hardware components, including peripherals like the ADC 108. The CPU 102 and the DMA 104 may interface the memory 106 with other hardware components and manage the transfer of data and instructions in and out of the memory 106.

The memory 106 includes one or more memory descriptors 112. In this context, a memory descriptor is a unit of memory that is configured for storing a set of parameters associated with a DMA transfer sequence. A memory descriptor 112 may be looked upon as a structure in memory that includes a configuration word. The DMA 104 may use memory descriptors 112 to transfer configuration data from the memory 106 to peripheral hardware for performing operations by the peripheral hardware. In addition, the DMA 104 may transfer results of the peripheral operations to the memory 106 using memory descriptors 112. The DMA 104 can be programmed to automatically set up and start another DMA transfer after the current DMA transfer completes by using the memory descriptors 112.

In some implementations, a memory descriptor 112 may be word-sized, that is, a 32 bit segment of memory 106. In other implementations, a memory descriptor 112 may be 64 bits in size. In yet other implementations, a memory descriptor 112 may be 128 bits or higher in size.

In some implementations, the memory descriptors 112 reside in consecutive memory locations in the memory 106. In such implementations, the DMA 104 expects a group of memory descriptors 112 to follow one another in the memory 106 like an array.

In other implementations, individual memory descriptors are not located in consecutive memory locations. In such implementations, a bit field in a descriptor may be used for pointing to the next memory descriptor in the memory. The bit field may be 16 bits, 32 bits or larger.

The ADC 108 is a peripheral hardware component of the system 100 that is configured for converting analog input into digital output. The ADC 108 may be any type of ADC, such as a direct-conversion ADC, a successive-approximation ADC, a ramp compare ADC, an integrating ADC, a delta-encoded ADC, a pipeline ADC, a sigma-delta ADC, a time-interleaved ADC, or any other suitable form of ADC. In some implementations, the ADC 108 may be an integrated circuit (IC) chip with several pins for input (analog) and output (digital). For each conversion sequence, a subset of the pins may be used, or the full set, depending on the size of the sequence.

The ADC controller 110 provides an interface for the ADC 108. The ADC controller 110 transfers the configuration settings and analog data for a conversion sequence to the ADC, and provides the digital output from the ADC.

The ADC controller 110 has a memory map associated with the controller. The memory map includes one or more hardware registers 114 that are used by the controller 110 for providing functionality to the ADC 108. For example, as shown in FIG. 1, the ADC controller 110 may include registers labeled Register_0 through Register_m.

In some implementations, the ADC controller 110 works with the DMA 104 to transfer ADC conversion settings, data and results directly between the memory 106 and the ADC 108, bypassing the CPU 102. Several registers in the memory map of the ADC controller 110 are used for communication with the DMA 104 to transfer settings, data and results associated with ADC sequencing.

In one implementation, the number of registers used by the ADC controller 110 is two. However, in other implementations, the number of registers used by the ADC controller may be a different number.

In some implementations, the size of a register 114 may be 32 bits. In other implementations, a register 114 may be 64 bits in size. In yet other implementations, a register 114 may be 128 bits or higher in size.

Referring to the implementation with two registers, the ADC controller 110 uses one register, which may be referred to as the configuration register, to store the configuration for the next ADC conversion operation coming from the memory 106. The ADC controller 110 uses the other register, which may be referred to as the results register, to transfer the data result to the memory 106. For example, the ADC controller 110 may use register 114a to store configuration settings for an ADC conversion sequence; the information stored in register 114a may come from memory descriptor 112a, being transferred by the DMA 104. Alternatively, the ADC controller 110 may use register 114a to store results data for an ADC conversion sequence; the DMA 104 may transfer the results data from the register 114a to the memory descriptor 112a.

In some implementations, the settings for an ADC conversion operation and the results data are stored in the memory descriptors 112 in the memory 106. Each memory descriptor may include information for one ADC sequence. However, in other implementations, the information for one ADC sequence may be mapped to several memory descriptors, or the information for multiple ADC sequences may be included in one memory descriptor.

Referring to the implementations in which a memory descriptor includes information on one ADC sequence, the DMA 104 transfers the configuration settings information included in a memory descriptor, such as 112a, to the ADC controller 110, as indicated previously. The ADC controller 110 interprets the information received from the DMA 104 and enters the information into the configuration register for the next ADC conversion operation. Once the operation is completed, the results data is made available in the results register, which is then transferred by the DMA 104 in a memory descriptor to the memory 106.

In some implementations, the DMA 104 moves one memory descriptor in one transfer operation. Since each memory descriptor corresponds to a single ADC sequence, each DMA transfer may be associated with one ADC conversion operation.

In some implementations, to initiate an ADC sequencing operation, the DMA 104 waits for a ready signal from the ADC controller. When the ready signal is received, the DMA 104 transfers the next memory descriptor in the transfer sequence to the ADC controller 110.

Upon receiving the transfer from the DMA 104, the ADC controller 110 pulls the ready signal low, which indicates that the ADC 108 is busy performing an ADC sequencing. The ADC controller 110 enters the per-channel settings data into the configuration register from the information received in the newly-transferred memory descriptor.

The ADC 108 is configured using the settings data from the configuration register and then performs the next ADC conversion operation. Upon completion of the ADC conversion operation, the digital result is stored in the results register of the ADC controller 110. The ADC controller sets the ready signal to high, indicating that the ADC sequencing is completed, and that the ADC is ready for the next operation. Subsequently, the DMA 104 transfers the results data from the results register, and also prepares to send the next memory descriptor for the next ADC conversion operation. Therefore, the ADC controller 110 may automatically take into account the DMA 104 transfer request when the ADC 108 is no longer busy and ready to execute the next conversion.

In accordance with the above, the DMA controller 104 and the ADC controller 110 communicate using a request/acknowledgement transfer mechanism to perform the ADC sequencing operations. The CPU 102 is not involved in the process of ADC sequencing. Therefore, the CPU 102 may be idle or performing some other operation unrelated to the ADC sequencing while an ADC conversion operation is performed. In some implementations, the CPU 102 may be in a sleep mode.

By avoiding CPU intervention for performing ADC sequencing in the manner described above, CPU processing may be reduced, leading to reduced power consumption. The system architecture also may be simplified by decoupling the CPU 102 from the ADC controller 110, while the DMA 104 uses pre-existing DMA data bus for communicating with the ADC controller 110 directly. The simplified system architecture may lead to lower cost. In addition, by removing the CPU 102 from the ADC sequencing, one layer of control for the ADC conversion operation is removed, which may lead to higher performance for the ADC sequencing, such as faster sequencing times.

In some implementations, the configuration information for ADC sequencing are programmed into the memory descriptors 112 by a user. The information in a memory descriptor corresponds to the information used by the configuration register of the ADC controller 110 for an ADC sequence conversion; therefore, the memory descriptor may be programmed according to the bit field mapping in the configuration register of the ADC controller 110. The information may include, among other settings, positive and negative channels, single-ended or bipolar conversion, amplification gain, gain compensation and operating mode.

The user may program a series of ADC conversion sequences, with each memory descriptor programmed to hold information corresponding to one conversion sequence. In this manner, the number of ADC conversion sequences may be limited only by the number of memory descriptors 112 that are available, that is, by the size of the memory 106.

The user is also provided with the flexibility to configure the ADC conversion by conversion and make the sequencing preferred by the user. For example, the user may program a loop in the ADC conversion by looping a memory descriptor. As another example, the user may perform "oversampling" by repeating several sequential conversions on the same channel.

Since a single configuration register may be used for configuring the ADC 108 independent of the number of ADC channels, the actual logic gate area of the ADC controller 110 and the DMA 104 are not impacted by the number of ADC channels. Therefore, the system design may be fully generic, without any offset according to the target channel. In addition, the cost associated with the chip area and the processing resources used for decoding may be reduced.

Summarizing the above features, the architecture of the computing system 100 facilitates autonomous ADC sequencing by using the DMA 104 and the ADC controller 110 for transferring configuration settings and results directly between the ADC 108 and the memory 106. The CPU 102, which is not involved in the ADC sequencing, may be in sleep mode, idle or performing some other unrelated activity while ADC conversion operations are executed.

The above architecture offers full flexibility regarding conversion settings applied for each channel. The number and type of the conversions in a sequence may be virtually unlimited—they are limited only by the number of memory descriptors 112, that is, by the size of the memory 106. The ADC conversions may be single-sequence or looped sequence. In addition, the ADC conversions may include oversampling capability, that is, repeating several sequential conversions on the same channel.

While the architecture of the computing system 100 has been described with reference to ADC conversion operation, it will be understood that the ADC conversion operation is one example of autonomous operations that may be performed without CPU intervention. For example, the computing system 100 may include one or more additional peripheral hardware modules along with associated controllers for managing the modules. The DMA 104 may be configured for autonomously sequencing the operations executed by a particular peripheral hardware module. The DMA 104 may facilitate the execution of operations performed by the particular peripheral hardware module by transferring memory descriptors directly between the memory and the controller associated with the particular peripheral hardware module without involving the CPU. The memory descriptors may include information for configuring the peripheral hardware module for executing operations. Consequently, the peripheral hardware module may execute operations without CPU intervention.

Figure 2:
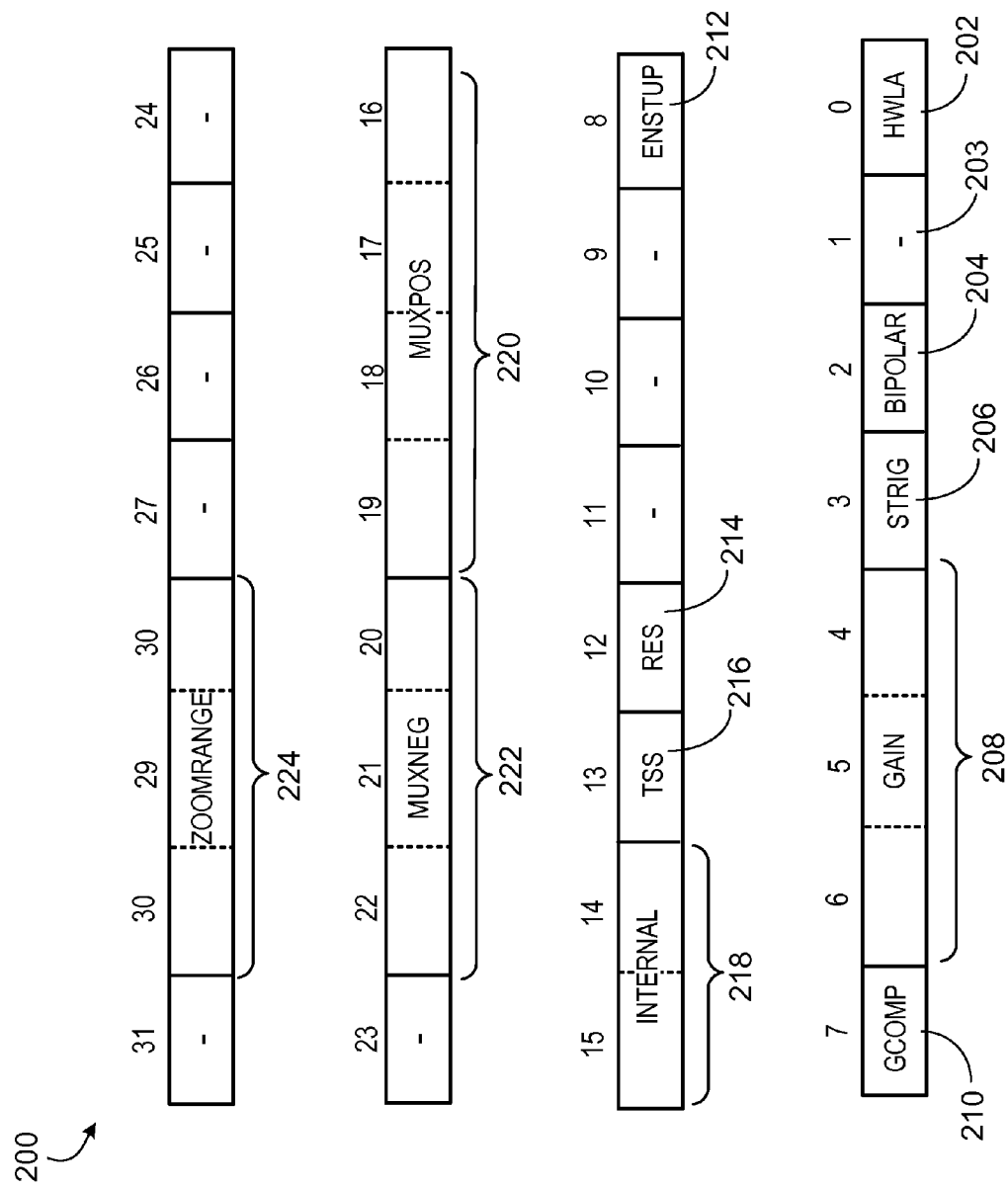
FIG. 2 is a conceptual block diagram of an exemplary configuration register used for ADC sequencing.

FIG. 2 is a conceptual block diagram of an exemplary configuration register 200 used for ADC sequencing. The configuration register 200 may be implemented in the ADC controller 110 for storing the configuration settings for the next ADC conversion operation. For example, the configuration register 200 may be same as the register 114a. The following describes the configuration register 200 as being implemented by the computing system 100. However, the configuration register 200 also may be implemented by other systems.

The configuration register 200 includes a number of bit fields, such as 202-224. FIG. 2 shows a 32 bit implementation of the configuration register 200, with the bits numbered 0 through 31. Some of the bits in the configuration register may be empty, that is, unmapped to any configuration setting of the ADC. For example, 203, which is numbered as bit 1, does not hold any settings value.

Some of the bit fields, such as 202-206 and 210-216, may include a single bit in the register, while some other bit fields, such as 208 and 218-224 may include more than one bit. For example, bit field 202 includes a single bit, which is numbered bit 0, while bit field 208 includes three bits, numbered bits 4, 5 and 6. Adjacent bits that are not in the same bit field are demarcated in FIG. 2 by a continuous line separating the bits, while a dotted line separating adjacent bits indicate that the adjacent bits are included in the same bit field. For example, bits numbered 2 and 3 are associated with different bit fields (204 and 206 respectively). However, bits numbered 4 and 5 are in the same bit field, 208.

Different parameters that are used for the configuration settings of the ADC are mapped to various bit fields in the configuration register 200. For example, bit field 202 holds the value for the configuration parameter HWLA, while bit field 204 holds the value for configuration parameter BIPOLAR. In some implementations, the number of bits that are included in a bit field are based on the range of values for the configuration parameter that is mapped to the bit field. For example, HWLA can take one of two values, and the corresponding bit field 202 includes a single bit, which therefore can hold one of two values in binary form ($2^1$=2). On the other hand, configuration parameter GAIN can hold one of eight values, and the corresponding bit field 208 includes 3 bits for representing eight different binary values ($2^3$=8).

The combination of the values of the configuration parameters for an ADC sequence may be different from the combination of values of the configuration parameters for the next ADC sequence. As described previously, the values of the configuration parameters are obtained from memory descriptors 112 in the memory 106. In some implementations, the memory descriptors 112 are programmed by the user consistent with the bit mapping illustrated in the configuration register 200. The following briefly describes the configuration parameters corresponding to the bit fields as illustrated in FIG. 2.

HWLA, which refers to "Half Word Left Adjust Result," may be used to adjust the data result on the left of a half-word or on the right. The value of 0 of the configuration parameter, that is, bit value 0 of bit field 202, enables the HWLA mode in an ADC sequencing operation. The value of 1 of the configuration parameter, that is, bit value 1 of bit field 202, enables the HWLA mode in an ADC sequencing operation.

The BIPOLAR configuration parameter may be used for selecting the ADC conversion mode. In some implementations, the ADC 108 has two conversion modes: differential and single-ended. If measuring signals where the positive input is at a higher voltage than the negative input, the single-ended (that is, unipolar) conversion mode should be used in order to have full 12-bit resolution in the conversion mode, which has only positive values. On the other hand, for ADC sequencing where the positive input may go below the negative input creating some negative results, the differential mode should be used in order to get correct results. The value of 0 of the BIPOLAR parameter, that is, bit value 0 of bit field 204, enables the differential mode in an ADC sequencing operation. The value of 1 of BIPOLAR, that is, bit value 1 of bit field 204, enables the single-ended mode in an ADC sequencing operation.

The STRING configuration parameter may be used as a software trigger for initiating an ADC conversion operation.

STRING value of 1, that is, bit value 1 of bit field 206, starts the conversion. STRING value of 0, that is, bit value 0 of bit field 206, has no effect.

The GAIN parameter may be used for amplifying the input analog signal before the ADC conversion operation. Different values of GAIN may allow the ADC 108 to affect different amplification for each conversion. The value of GAIN, which may be referred as gain factor, may range from ½× (halve the amplification) to 64× (64 times amplification).

The GCOMP parameter, which is mapped to bit field 210, may be used for gain compensation. In some implementations, GCOMP may be used to obtain a result that is more accurate than an ADC conversion result that does not use gain compensation.

The ENSETUP parameter, which corresponds to bit field 212, may be used to enable a startup time counter before the associated ADC conversion operation.

The RES parameter, which is mapped to bit field 214, may be used for selecting the resolution of the ADC 108. In some implementations, the ADC 108 may implement a cyclic pipeline that has 12-bit or 8-bit resolution. Accordingly, the digital result may be transferred in 12-bits or 8-bits, respectively, with 12-bits typically being more accurate than 8-bits.

The TSS parameter, which is mapped to bit field 216, may be used to start or stop an internal timer of the ADC controller 110. In some implementations, the ADC controller 110 may embed an internal timer, which may be used as a trigger source that can be configured by setting the corresponding field in an associated register in the ADC controller 110. The value 1 of the TSS parameter, that is, bit value 1 of bit field 216, starts the internal timer, while value 0 of the TSS parameter, that is, bit value 0 of bit field 216, stops the internal timer. If the bit field is set before starting an ADC conversion operation, the internal timer counts down its value.

The INTERNAL parameter, which is mapped to bit field 218, may be used to select the inputs of the ADC 108 that may be enabled for negative and positive multiplexing (MUX). The MUXPOS parameter, which is mapped to bit field 220, may be used for MUX selection for positive ADC input. The MUXNEG parameter, which is mapped to bit field 222, may be used for MUX selection for negative ADC input. The MUXPOS and MUXNEG parameters may be used for selecting input pins of the ADC 108 for the ADC conversion operation.

The ZOOMRANGE parameter, which is mapped to bit field 224, may be used for selecting a part of a range of the reference voltage and shift the select range by a known value, such as between 0 and 4095 in decimal value. In some implementations, the ADC may use GAIN for amplification, in which case the input range is shifted with a programmable voltage. In such implementations, the input voltage range may be programmed based on a reference voltage, using a range around the reference voltage.

The values of the configuration parameters in the configuration register 200 may be cleared by entering a "reset" value for the configuration register 200. In some implementations, the reset value for the configuration register 200 may be zeroes for all bits, which is represented in hexadecimal representation as 0x00000000.

Figure 3A:
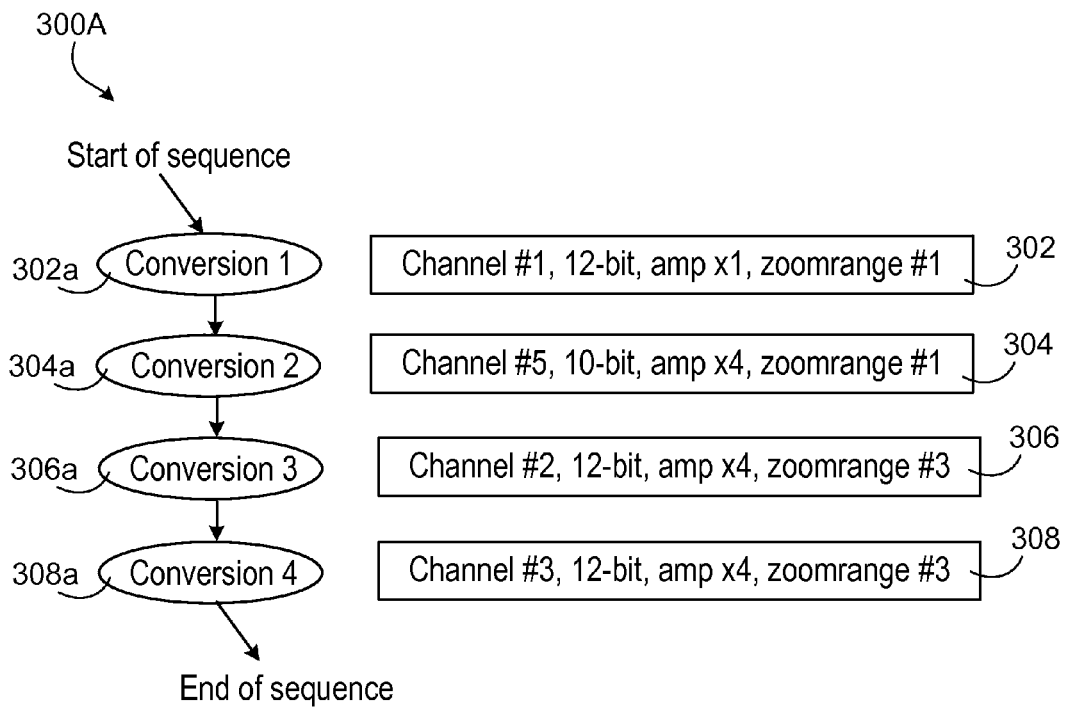
FIGS. 3A-3C are a conceptual block diagrams illustrating exemplary ADC conversion sequences.
Figure 3B:
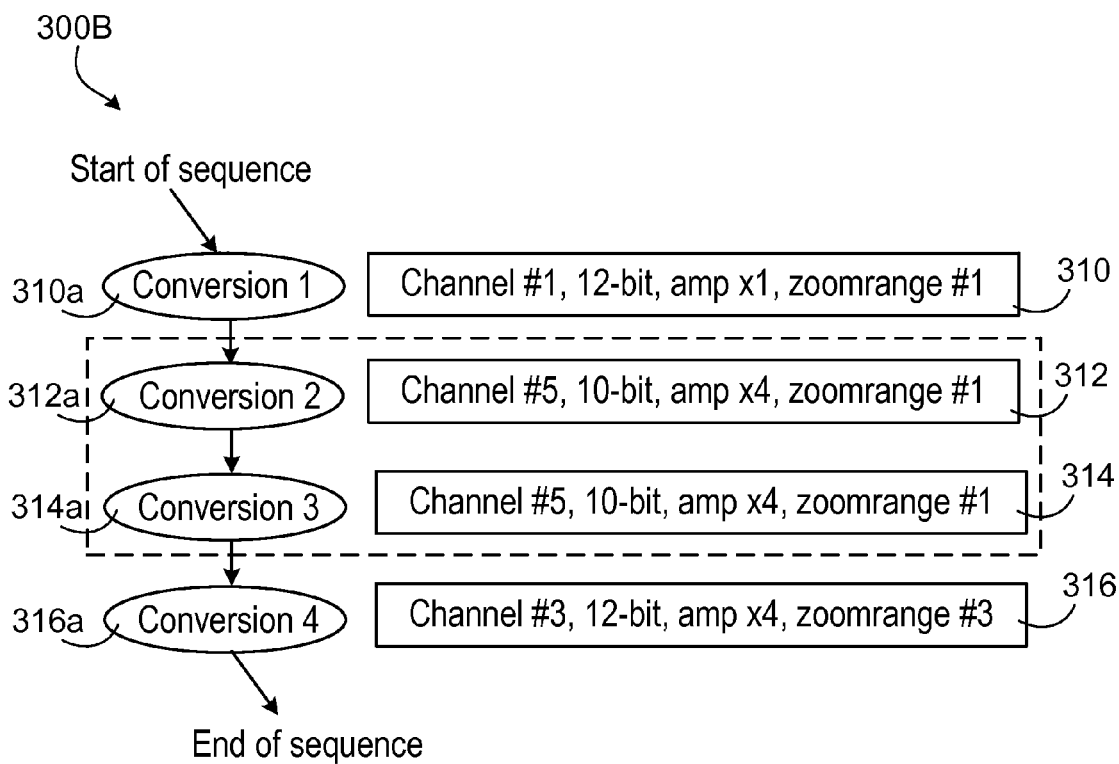
Figure 3C:
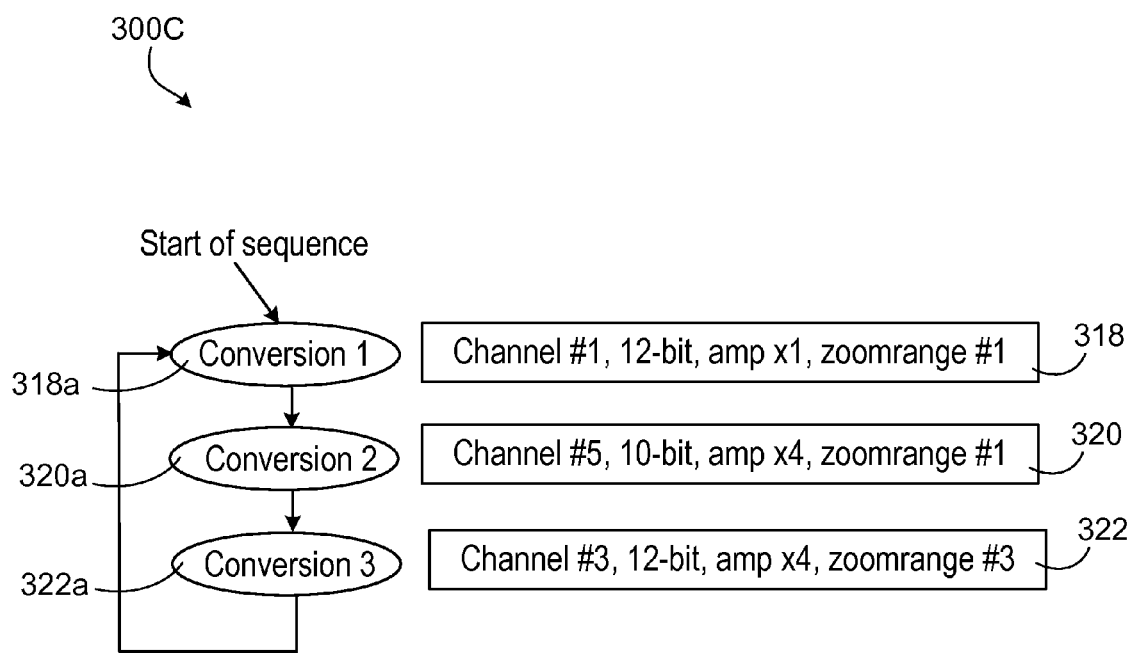

FIGS. 3A-3C are a conceptual block diagrams illustrating exemplary ADC conversion sequences 300A-300C respectively. The conversion sequences 300A-300C may be executed in an ADC autonomously without CPU intervention. For example, the conversion sequences 300A-300C may be executed by the ADC 108 using configuration settings that are transferred from via memory descriptors 112 from the memory 106, via the DMA 104 and the ADC controller 110.

The following describes the conversion sequences 300A-300C as being implemented by the computing system 100. However, the conversion sequences 300A-300C also may be implemented by other systems.

FIG. 3A shows an exemplary 4-channel ADC conversion sequence 300A with independent settings for each channel. The conversion sequence 300A includes memory descriptors 302-308 with four different configuration settings, and the associated ADC conversion operations 302a-308a respectively.

Each memory descriptor 302, 304, 306 or 308 represents a different ADC conversion operation 302a, 304a, 306a or 308a respectively. The memory descriptors may be part of the memory descriptors 112 in the memory 106, and they are stored in the memory 106 at consecutive memory address.

The configuration settings may be programmed into the memory descriptors 302-308 by the user. Each memory descriptor includes parameter values for a different ADC channel. For example, memory descriptor 302 includes configuration settings for channel 1 of the ADC 108. As shown, the configuration settings for channel 1 includes 12-bit for parameter RES, a GAIN value of 1 and a ZOOMRANGE value of 1. Memory descriptors 304, 306 and 308 include configuration settings for channels 5, 2 and 3 respectively of the ADC 108.

In the exemplary conversion sequence 300A, the DMA 104 transfers memory descriptor 302 to the ADC controller 110 upon receiving the ready signal. The ADC controller 110 maps the parameter values from the memory descriptor 302 to the bit fields in the configuration register 200. The ADC conversion operation 302a commences for channel 1 once the ADC 108 is configured with the settings corresponding to the memory descriptor 302. When the operation is completed, the digital data is output in the results register, and the ADC controller 110 pulls the ready signal high, thereby indicating to the DMA 104 that it is ready for the next ADC conversion.

Subsequently, the DMA 104 transfers memory descriptor 304 to the ADC controller 110, which maps the parameter values from the memory descriptor 304 to the bit fields in the configuration register 200. Conversion operation 304a commences for channel 5 once the ADC 108 is configured with the settings corresponding to the memory descriptor 304. In a similar manner, conversion operations 306a and 308a are executed in series for different channels 2 and 3, and then the sequence is completed.

The four conversion operations 302a-308a are independent of one another. Therefore, they may be performed in any order, based on the arrangement of the memory descriptors 302-308 in the conversion sequence.

FIG. 3B shows an exemplary 4-channel ADC conversion sequence 300B with oversampling. The conversion sequence 300B includes memory descriptors 310-316 with four different configuration settings, and the associated ADC conversion operations 310a-316a respectively.

Oversampling is a technique that is implemented in some ADCs for improving the accuracy of the result by measuring the same signal two times sequentially. In the conversion sequence 300B, oversampling is achieved by programming two similar sequential conversion operations, that is, by duplicating a memory descriptor in the memory 106. For example, the user programs the memory descriptors 312 and 314, which are in consecutive addresses in the memory 106, to include similar configuration settings for the same channel, that is, channel 5, of the ADC 108.

In a manner similar to that described for sequence 300A, ADC conversion operations are executed in sequence 300B using configuration settings provided by the memory descriptors 310-316. The conversion operations 312a and 314a produce two results or "samples," which are the output of identical ADC conversions due to the similar configuration settings provided by the memory descriptors 312 and 314. Therefore, the conversion operations 312a and 314a achieve an oversampling of the result. Subsequently, the two results may be processed by other means for improving the accuracy of the digital data.

FIG. 3C shows an exemplary 3-channel ADC conversion sequence 300C with looping. The conversion sequence 300C includes memory descriptors 318-322 with three distinct configuration settings for three different channels, and the associated ADC conversion operations 318a-322a respectively.

The memory descriptors 318, 320 and 322 are similar to the memory descriptors associated with conversion sequences 300A and 300B. The memory descriptors 318, 320 and 322 are programmed by the user in consecutive memory addresses of the memory 106. The DMA 104 transfers the memory descriptors to the ADC controller 110, in a manner similar to that described previously for sequence 300A, for configuring the ADC 108 settings for performing associated the ADC conversion operations.

The DMA 104 is programmed by the user to loop back and read the memory address corresponding to the first descriptor 318 once the conversion operation 322a, corresponding to the third descriptor 322, is completed. Therefore, the conversion sequence of 318a-322a may be repeated in the ADC 108.

The user may program the DMA 104 to perform the loop indefinitely. Consequently, the 3-channel conversion sequence may be an unlimited ADC conversion sequence.

While 300A-300C show three different autonomous conversion sequences using the computing system 100, other types of ADC conversion sequences may be performed using the computing system 100. These may be achieved by programming the memory descriptors 112 in various permutations and combinations, including any suitable combination of the sequences 300A-300C.

Figure 4A:
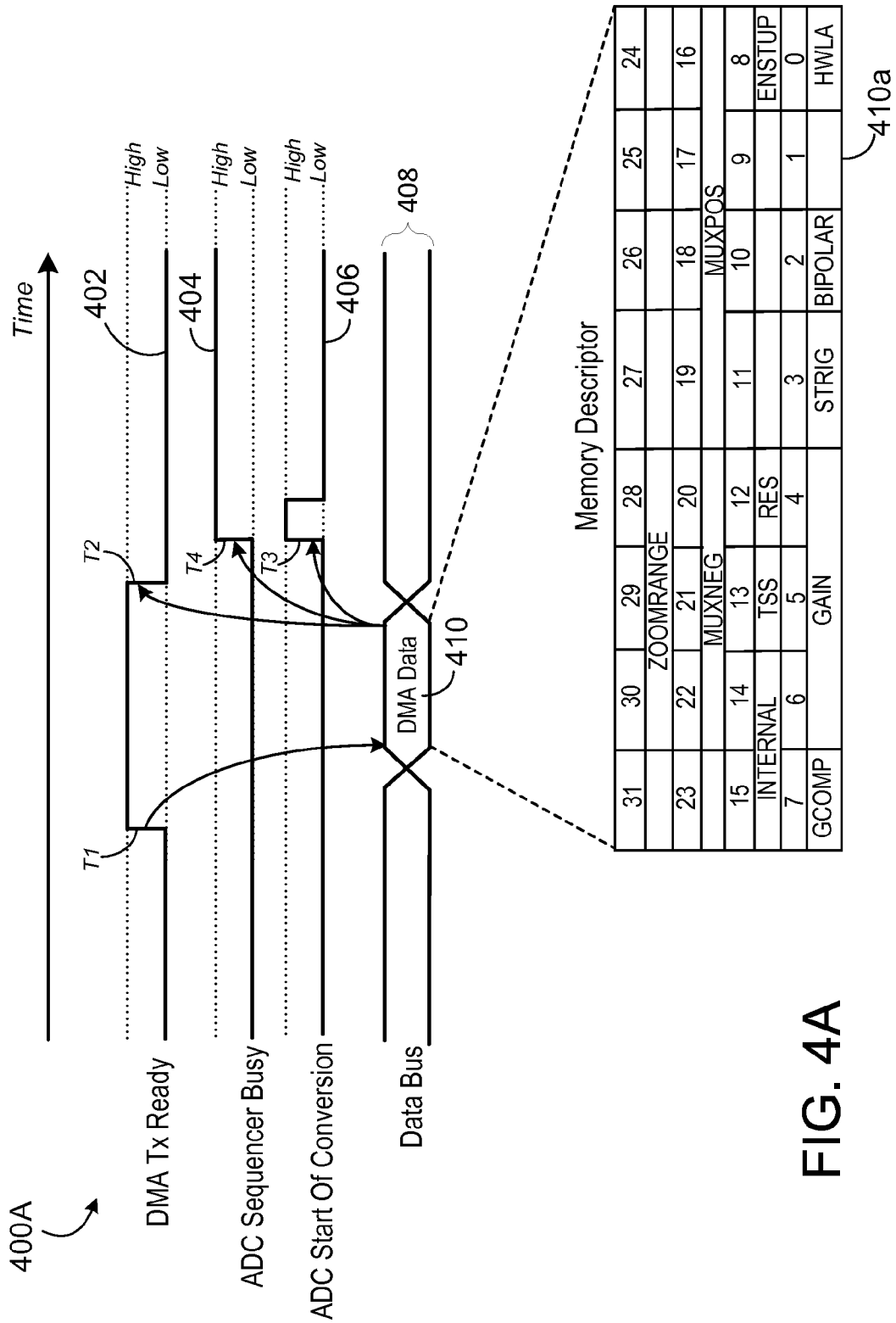
FIGS. 4A and 4B are conceptual block diagrams illustrating signal transitions for performing autonomous ADC sequencing.
Figure 4B:
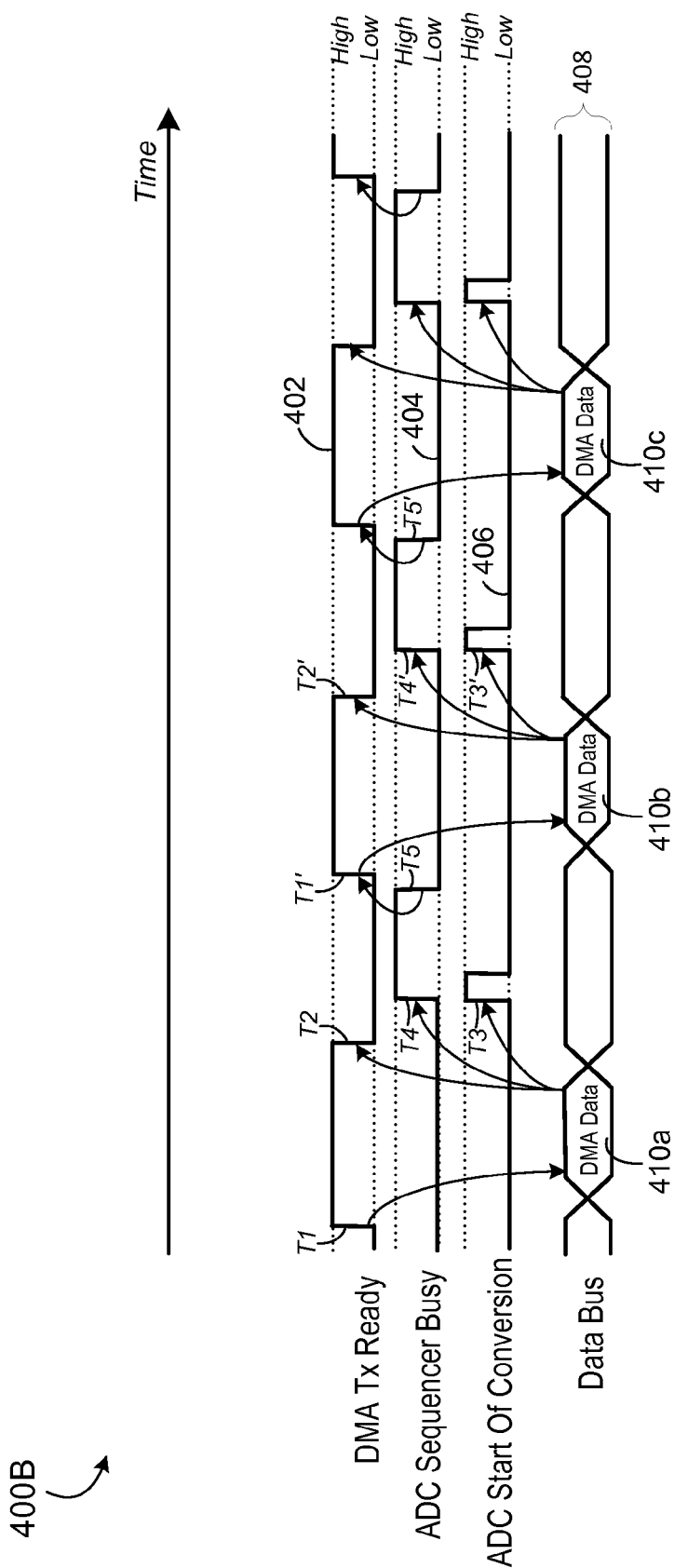

FIGS. 4A and 4B are conceptual block diagrams illustrating signal transitions 400A and 400B for performing autonomous ADC sequencing. The signal transitions may be associated with the components of the computing system 100, such as the DMA 104, the ADC 108 and the ADC controller 110. The following describes the signal transitions 400A-400B with regard to computing system 100. However, the signal transitions 400A-400B also may be implemented by other systems.

FIG. 4A shows an exemplary signal transition 400A for a single autonomous ADC sequencing. The signal transition 400A includes signals 402-408. Signal 408 includes data 410, such as memory descriptor 410a. Time instants T1-T4 mark the transition points for the different signals.

Signal 402, referred to as 'DMA Tx (that is, transmit) Ready," indicates the activity level of the DMA 104 for a single memory descriptor transfer operation. Signal 404, which is referred to as "ADC Sequencer Busy" indicates the activity of the ADC 108 for performing a conversion operation associated with the DMA transition 402. Signal 406, which is referred to as "ADC Start of Conversion," represents a signal by the ADC controller 110 when the ADC 108 initiates the conversion operation. Signal 408 represents the data bus that is used by the DMA 104 to transfer DMA data 410, such as memory descriptor 410a, to the ADC controller 110.

Initially, the DMA 104 is not performing any data transfer, as indicated by the signal 402 being low. Upon receiving the ready signal from the ADC controller 110, the DMA 104 starts transferring, at time T1, the memory descriptor for the next ADC sequencing. This is indicated by the signal 402 going high at time T1, when the DMA places the DMA data 410 in the Data Bus 408. The DMA 104 stays active for the duration of time it takes to transfer the DMA data 410 on to the data bus 408. The completion of the transfer at time T2 is indicated by the signal 402 going low.

The data bus 408 connects the DMA 104 to the ADC controller 110. In some implementations, the data bus 408 may be a peripheral bus that interconnects different hardware modules of the computing system 100.

The DMA data 410 includes memory descriptors, such as 410a, that are programmed in the memory 106 with configuration settings for ADC conversion operations. For example, the memory descriptor 410a may include configuration data that maps to the bit fields in the configuration register 200.

Once the transfer is completed at T2, the data 410 is received from the data bus 408 by the ADC controller 110, which maps the data to the configuration register. Subsequently, the ADC 108 is configured for the next operation, which commences at time instant T3. The start of the ADC sequencing is indicated by the signal 406 going high briefly at T3. The ADC 108 remains busy for the duration of the conversion operation, which is indicated by the signal 404 going high at time instant T4. In some implementations, the signals 404 and 406 may go high at nearly the same time, such that T3 and T4 may refer to the same time instant.

FIG. 4B shows an exemplary signal transition 400B for multiple autonomous ADC sequencing. The signal transition 400B includes the same signals 402-408 as signal transition 400A. However, signal transition 400B illustrates the signals 402-408 for multiple ADC conversion operations, corresponding to the DMA data 410a-410c. Time instants T1-T5 mark the transition points of the different signals 402-408 for the first ADC operation, while time instants T1'-T5' mark the transition points of the different signals 402-408 for the next ADC operation.

As shown by signal transition 400B, the first ADC sequencing, which is same as the ADC sequencing described by 400A, may end at time instant T5. This is indicated by the signal 404 going from high to low at T5, signaling that the ADC 108 is not busy anymore and ready for the next operation.

Subsequently, upon receiving the ready signal, the DMA 104 prepares the next data transfer, which is indicated by the signal 402 transitioning to high at time instant T1'. The DMA 104 transfers DMA data 410b to the ADC controller 110 using the data bus 408. The data 410b, and similarly 410c, may include memory descriptors from sequential addresses in the memory 106 following the location for data 410a.

When the DMA data 410b transfer is complete, the DMA 104 moves to wait state, as indicated by the signal 402 going low at time instant T2'. The ADC controller 110 receives the data 410 from the data bus 408 and maps the data to the configuration register. Subsequently, the ADC 108 is configured for the second conversion operation corresponding to the data 410b, which commences at time instant T3'. The start of the second ADC sequencing is indicated by the signal 406 going high briefly at T3'. The ADC 108 remains busy for the duration of the conversion operation, which starts at time instant T4' and ends at time instant T5'. This is indicated by the signal 404 remains high during the period T4'-T5', indicating that the ADC 104 is busy performing a sequencing. The signals 404 and 406 may go high at nearly the same time, such that T3' and T4' may refer to the same time instant.

The second ADC sequencing ends at time instant T5', as indicated by the signal 404 going from high to low at T5'. Subsequently, the DMA 104 prepares for transferring the next memory descriptor 410c, and the signal transition sequence repeats similar to T1-T5, or T1'-T5'.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A device comprising:
a central processing unit (CPU);
a memory configured for storing memory descriptors;
an analog-to-digital converter controller (ADC controller) configured for managing an analog-to-digital converter (ADC) using the memory descriptors; and
a direct memory access (DMA) system configured for autonomously sequencing conversion operations performed by the ADC without CPU intervention by transferring the memory descriptors directly between the memory and the ADC controller for controlling the conversion operations performed by the ADC,
wherein the ADC controller is configured for setting parameters for conversion operations performed by the ADC based on information included in the memory descriptors received from the DMA system, and wherein the information included in the memory descriptors are configured independent of the CPU.

2. The device of claim 1, wherein the CPU is configured to be idle or performing reduced activities at a time when conversion operations are performed by the ADC.

3. The device of claim 2, wherein CPU is configured to be performing activities unrelated to the ADC at the time when the conversion operations are performed by the ADC.

4. The device of claim 1, wherein the memory descriptors in the memory are managed by the DMA system, and
wherein the ADC controller is not directly coupled to the memory.

5. The device of claim 1, wherein the memory descriptors received from the DMA system at the ADC controller comprise information on per-channel settings for conversion operations performed by the ADC, wherein a channel is associated with an input pin of the ADC.

6. The device of claim 5, wherein the information included in the memory descriptors are arranged as bit fields that comprise amplification gain, gain compensation, single-ended or bipolar operating mode, channel polarity and selection of negative and positive channels of the ADC.

7. The device of claim 1, wherein the ADC controller includes a first register configured for storing parameters for a conversion operation performed by the ADC, and wherein the ADC controller is operable to:
receive a memory descriptor from the DMA system via a peripheral data bus;
extract, from the memory descriptor, information on a conversion operation to be performed by the ADC; and
map the extracted information to the first register.

8. The device of claim 7, wherein the information included in a memory descriptor received from the DMA system corresponds to one conversion operation performed by the ADC.

9. The device of claim 7, wherein the ADC controller includes a second register configured for storing a result of a conversion operation performed by the ADC, and
wherein the ADC controller is operable to generate a signal indicating that the conversion operation performed by the ADC is completed.

10. The device of claim 9, wherein the result of the conversion operation performed by the ADC is transferred from the second register to the memory using a memory descriptor, and wherein the DMA system is operable to:
receive, from the ADC controller, the signal indicating that the conversion operation performed by the ADC is completed; and
in response to receiving the signal, transfer the result of the conversion operation from the second register to the memory using the memory descriptor.

11. The device of claim 1, wherein the DMA system is configured for autonomously sequencing conversion operations performed by an additional peripheral hardware without CPU intervention by transferring the memory descriptors directly between the memory and a controller managing the additional peripheral hardware.

12. The device of claim 1, wherein the DMA system is configured for transferring memory descriptors to the ADC controller in response to receiving a ready signal from the ADC controller.

13. The device of claim 12, wherein a ready signal is uniquely associated with a single transfer cycle.

14. The device of claim 13, wherein the DMA system is configured for transferring a single memory descriptor in one transfer cycle.

15. The device of claim 1, wherein a number of conversion operations performed by the ADC is limited by a number of the memory descriptors stored in the memory.

16. The device of claim 1, wherein an order of the conversion operations performed by the ADC is based on an arrangement of the memory descriptors in the memory.

17. The device of claim 1, wherein a size of a memory descriptor is 32 bit, 64 bit or 128 bit.

18. A method comprising:
accessing, by a direct memory access (DMA) system, a first memory descriptor stored in a memory that include information on parameter settings for a first operation performed by a peripheral hardware module, wherein information included in memory descriptors stored in the memory are configured independent of a central processing unit (CPU) associated with the DMA system, and wherein the accessing is performed by the DMA without CPU intervention;
transferring, by the DMA system, the first memory descriptor to a controller associated with the peripheral hardware module, wherein the information included in the first memory descriptor is stored in a first register associated with the controller, and wherein the transferring is performed by the DMA without CPU intervention;
receiving, at the DMA system, a signal from the controller indicating that the first operation performed by the peripheral hardware module managed is completed;
in response to receiving the signal:
transferring, by the DMA system, a result of the first operation from a second register associated with the controller to the memory using the first memory descriptor, wherein the transferring is performed by the DMA without CPU intervention;

accessing, by the DMA system, a second memory descriptor stored in the memory that include information on parameter settings for a second operation performed by the peripheral hardware module; and transferring, by the DMA system, the second memory descriptor to the controller, wherein the information included in the second memory descriptor is stored in the first register associated with the controller.

19. The method of claim 18, comprising:

receiving, by the controller, the first memory descriptor from the DMA system;

extracting, by the controller and from the first memory descriptor, information on the first operation to be performed by the peripheral hardware module;

storing, by the controller, the extracted information about the first operation in the first register;

configuring, by the controller, the peripheral hardware module to perform the first operation based on the information stored in the first register;

storing, by the controller, result of the first operation in the second register; and generating, by the controller, the signal indicating that the first operation performed by the peripheral hardware module is completed.

20. The method of claim 19, wherein the information included in the first memory descriptor is arranged as bit fields, and wherein storing the extracted information about the first operation in the first register comprises:

mapping, by the controller, the extracted information to corresponding bit fields the first register.

* * * * *